(12) United States Patent
Kaufmann et al.

(10) Patent No.: US 8,749,011 B2
(45) Date of Patent: Jun. 10, 2014

(54) SYSTEM AND METHOD FOR REDUCING VOLTAGE DROPS IN INTEGRATED CIRCUITS

(75) Inventors: Matthew Kaufmann, Morgan Hill, CA (US); Morteza Cyrus Afghahi, Coto de Caza, CA (US)

(73) Assignee: Broadcom Corporation, Irvine, CA (US)

( * ) Notice: Subject to any disclaimer, the term of this patent is extended or adjusted under 35 U.S.C. 154(b) by 2523 days.

(21) Appl. No.: 11/114,418

(22) Filed: Apr. 26, 2005

(65) Prior Publication Data

US 2006/0192297 A1    Aug. 31, 2006

Related U.S. Application Data

(60) Provisional application No. 60/657,548, filed on Feb. 28, 2005.

(51) Int. Cl.
*H01L 27/14* (2006.01)

(52) U.S. Cl.
USPC ............ 257/459; 257/724; 257/777; 438/612

(58) Field of Classification Search
USPC .......................... 257/459.724, 777; 438/612
See application file for complete search history.

(56) References Cited

U.S. PATENT DOCUMENTS

| | | | |
|---|---|---|---|
| 6,472,747 B2 * | 10/2002 | Bazarjani et al. | 257/724 |
| 6,577,008 B2 | 6/2003 | Lam et al. | |
| 6,762,117 B2 | 7/2004 | Lam et al. | |
| 6,864,565 B1 | 3/2005 | Hool et al. | |
| 6,867,122 B2 | 3/2005 | Weng | |
| 7,016,794 B2 * | 3/2006 | Schultz | 702/64 |
| 2005/0108662 A1 * | 5/2005 | Morfey et al. | 716/1 |

* cited by examiner

*Primary Examiner* — Howard Weiss
*Assistant Examiner* — Steven Rao
(74) *Attorney, Agent, or Firm* — Brinks Gilson & Lione (57) ABSTRACT

In one embodiment, a die arrangement is disclosed in which a wire-bond pad may be operatively coupled to a power supply via a wire bond. A first pad may be operatively coupled to the wire-bond pad. A second pad may be operatively coupled to the first pad via a redistribution layer.

25 Claims, 11 Drawing Sheets

SYSTEM AND METHOD FOR REDUCING VOLTAGE DROPS IN INTEGRATED CIRCUITS

RELATED APPLICATION

This application makes reference to, claims priority to and claims benefit from U.S. Provisional Patent Application Ser. No. 60/657,548, filed on Feb. 28, 2005. The above-identified application is hereby incorporated by reference herein in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

As semiconductor chips begin to integrate more and more diversified functional blocks, power supply provisioning and power supply distribution on the chips become more and more challenging. High speed and high performance functional blocks generally consume substantial amounts of power. Some high speed and high performance functional blocks may need to minimize their voltage drops with respect to their power supply to operate, for example, at peak efficiency. Especially in an environment in which the voltage level of a power supply to a chip scales down, the demand for greater amounts of power may result in higher electrical currents which, in turn, may result to the undesirable effect of higher voltage drops on, for example, highly resistive, thin metal layers of the integrated circuit (IC) chip. In addition, as the chip scales down, the tolerances or allowable variations in the voltage drops also decreases.

The integration of analog functional blocks and digital function blocks on the same chip may also provide further challenges. Analog blocks tend to be typically sensitive to noise. Thus, the routing of metal layers carrying noisy electrical signals (e.g., noisy digital signals to and from digital functional blocks) or noisy power supply voltages and noisy power ground voltages may have detrimental effects on nearby analog functional blocks.

Figure 9:
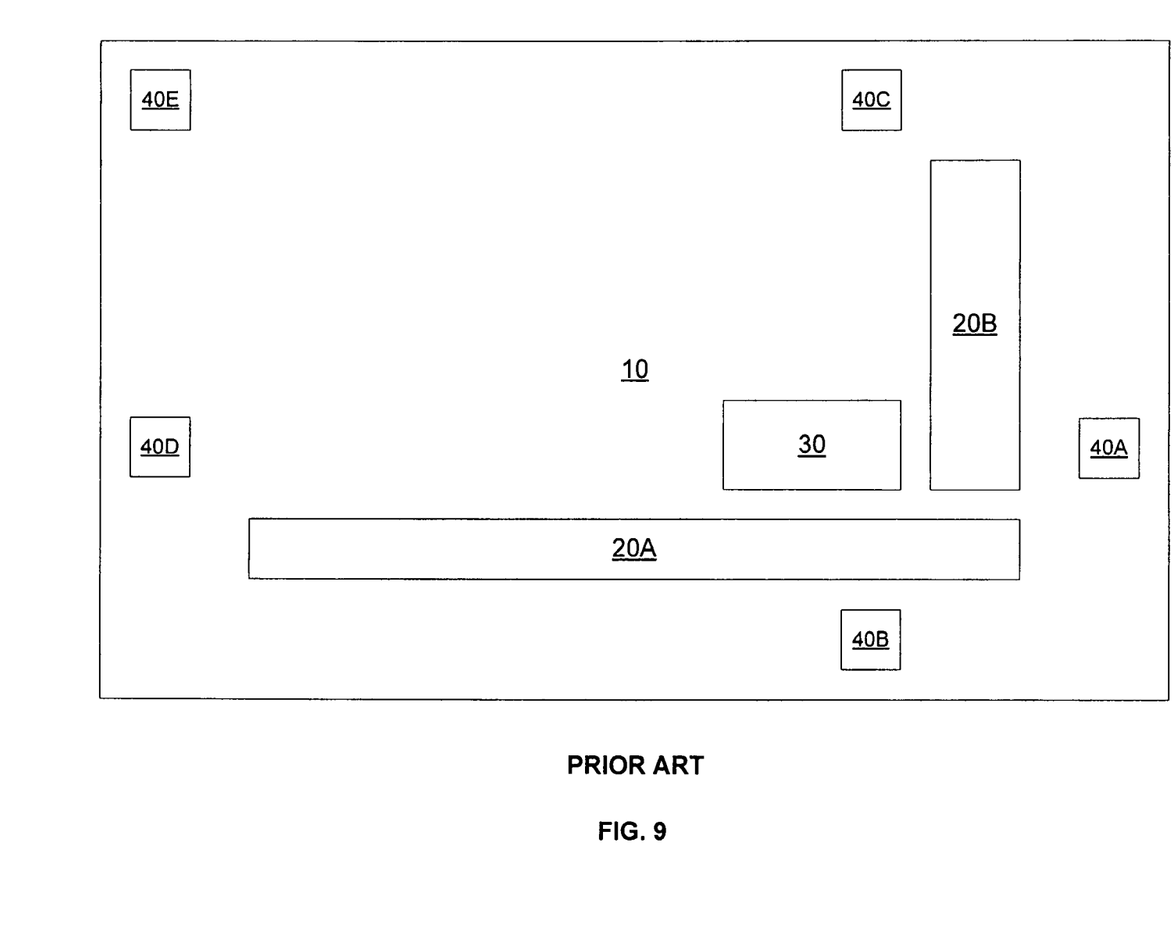
FIG. 9 shows a conventional die arrangement.

FIG. 9 shows a simplified block diagram of a die 10 that includes, for example, two analog functional blocks 20, a digital functional block 30 and wire-bond pads 40. In the simplified block diagram, only a few of the components are shown for illustration purposes and their disposition in the die 10 is merely for illustration purposes. The analog blocks are disposed near the edge of the die 10 to access their power supply interfaces and their signal interfaces. The proximity between the analog functional blocks 20 and their interfaces on the edge of the die 10 avoids interference resulting from other function blocks such as, for example, the digital function block 30. In addition, the proximity between the analog functional blocks 20 and their interfaces reduces the amount of voltage drop, for example, from a nearby wire-bond pad supplying a power supply voltage.

FIG. 9 also illustrates a design problem with respect to the digital functional block 30. The digital functional block 30 also needs to connect to at least one of the wire-bond pads 40. However, due to the sensitivity of the analog functional blocks 20, options may be limited. For example, the digital functional block 30 can not simply connect via a chip metal layer, for example, to wire-bond pad 40A or wire-bond pad 40B. In some implementations, the chip metal layer would pass right over an analog functional block 20A, 20B or would pass by a nearby analog functional block 20A, 20B (e.g., through the spatial gap between the analog functional blocks 20A, 20B) in connecting to the wire-bond pad 40A, 40B. The interference and noise from the chip metal layer would detrimentally affect the analog functional blocks 20A, 20B. In other possible implementations, the chip metal layer might pass by nearby analog functional blocks (e.g., analog functional blocks 20A, 20B), which increases interference, over a longer line path, which increases voltage drop, to the wire-bond pads (e.g., wire-bond pads 40C, 40D). In yet another possible implementation, the chip metal layer might pass over an even longer line path which further increases voltage drop to the wire-bond pads (e.g., wire-bond pad 40E).

Currently, one of the approaches is to use "flipchip" packaging. However, such an approach has proven to be a rather costly solution.

Further limitations and disadvantages of conventional and traditional approaches will become apparent to one of ordinary skill in the art through comparison of such systems with some embodiments according to some aspects of the present invention as set forth in the remainder of the present application with reference to the drawings.

BRIEF SUMMARY OF THE INVENTION

Aspects of the present invention may be found in, for example, systems and methods that reduce voltage drops in integrated circuits.

These and other features and advantages of the present invention may be appreciated from a review of the following detailed description of the present invention, along with the accompanying figures in which like reference numerals refer to like parts throughout.

DETAILED DESCRIPTION OF THE INVENTION

Some embodiments according to some aspects of the present invention may relate to packages. In some embodiments according to some aspects of the present invention, a package may include, for example, an integrated circuit package or a semiconductor chip package. In some embodiments according to some aspects of the present invention, the package may include, for example, a ball grid array (BGA) package. In some embodiments according to some aspects of the present invention, the package may include, for example, die arrangements.

Some embodiments according to some aspects of the present invention may address the problem of voltage drop in integrated circuits in a substantially cost-effective manner. Some embodiments according to some aspects of the present invention may provide, for example, low-cost package technology such as, for example, low-cost, wire-bond package technology.

Figure 1:
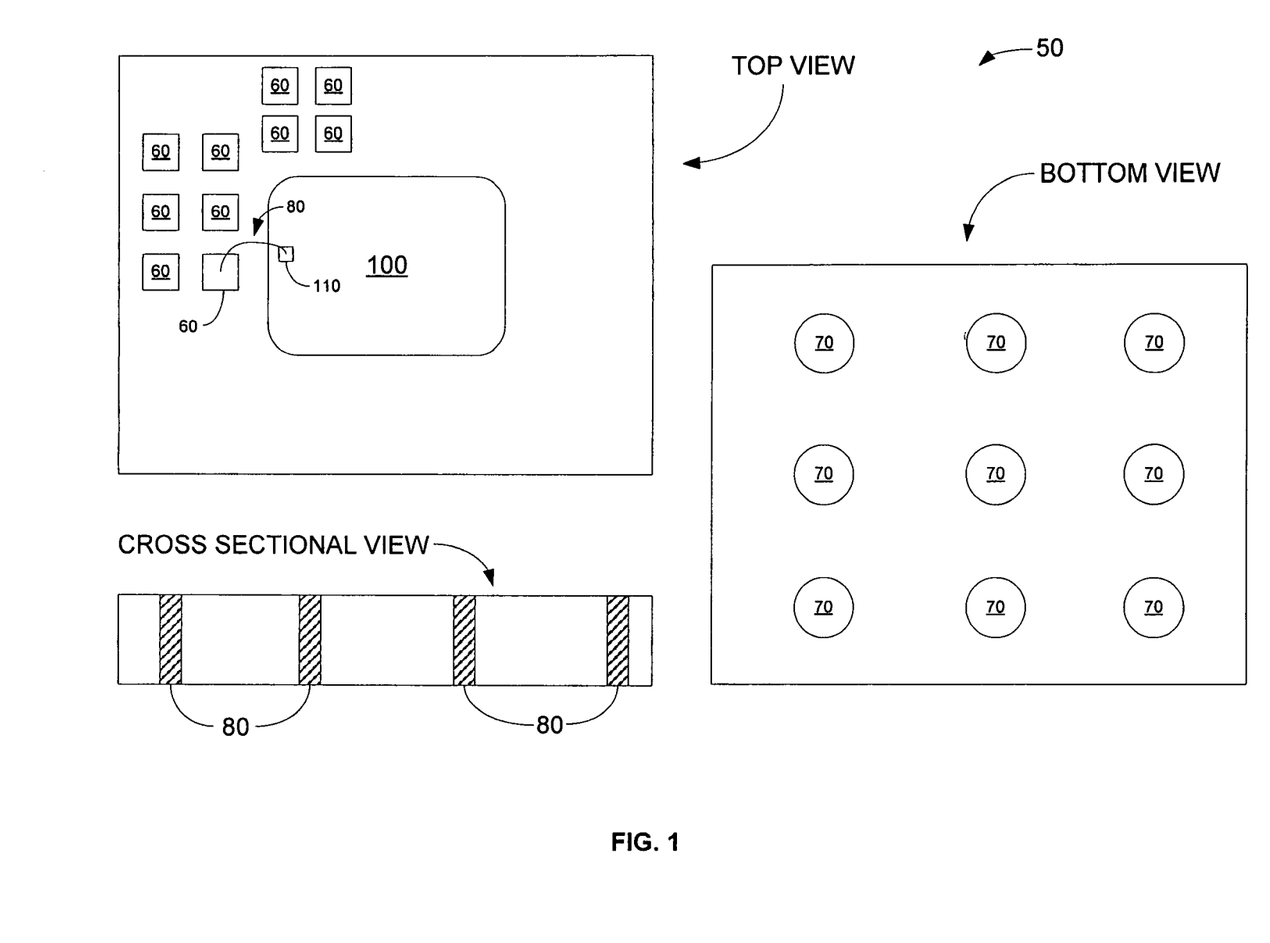
FIG. 1 shows three views of an embodiment of a package according to some aspects of the present invention.

FIG. 1 shows three partial views of an embodiment of a package according to some aspects of the present invention. As illustrated, the package 50 has its overmold (e.g., epoxy overmold) removed and has been greatly simplified for discussion. Many of the conventional details of the package 50 are not illustrated since they are well known in the art.

In the top view of the package 50, a die 100 has been mounted on the package. The die 100 includes, for example, a plurality of wire-bond pads 110. Only one of the wire-bond pads 110 is shown. The package also includes, for example, its own wire-bond pads 60. Only some of the wire-bond pads are illustrated. The die 100 may be coupled to the package through, for example, a plurality of wire bonds 80. As illustrated, one of the wire bonds 80 couples one of the wire-bond pads 60 of the package 50 to one of the wire-bond pads 110 of the die 100. The wire bonds 80 may carry, for example, power supply voltages or currents, an electrical ground or signals (e.g., clock signals).

A bottom view of the package illustrates the external leads 70 (e.g., pins, pads, or solder balls) of the package. The configuration or placement of the external leads 70 and the wire-bond pads 60, 110 can be different than illustrated depending upon the particular implementation. The external leads 70 may be coupled, for example, to a higher level system (e.g., a printed circuit board).

A partial cross sectional view illustrates coupling 80 between the top side and the bottom side of the package 50. The coupling 80 may include, for example, one or more of the following: a via, an interconnect or a lead. The coupling 80 may provide, for example, electrical and/or thermal connections between the top side and the bottom side of the package 50.

Figure 2:
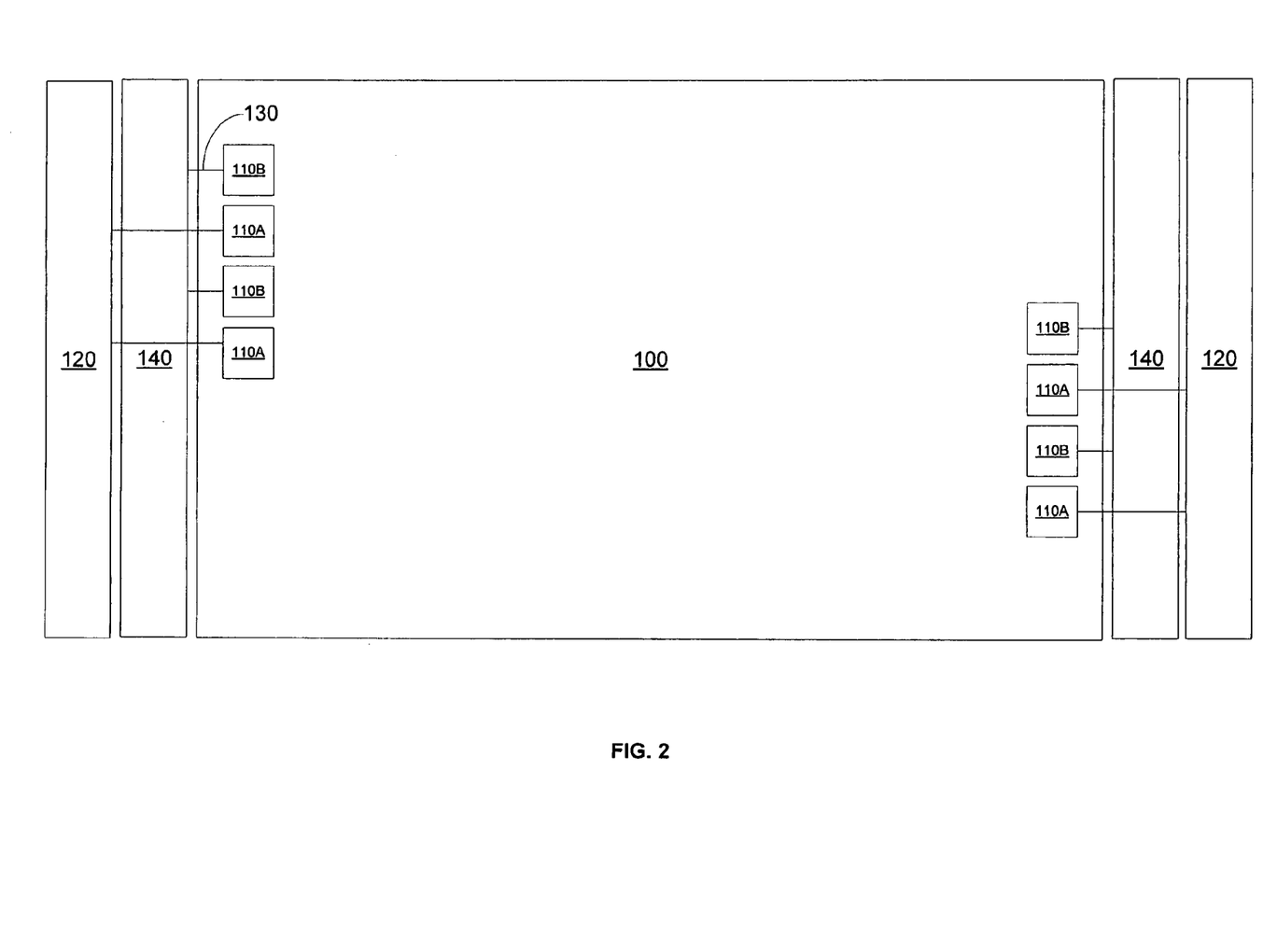
FIG. 2 shows an embodiment of a die arrangement according to some aspects of the present invention.

FIG. 2 shows an embodiment of a die arrangement according to some aspects of the present invention. In some embodiments according to some aspects of the present invention, the die 100 may comprise a finished integrated circuit chip. A die 100 may include, for example, wire-bond pads 110. Wire-bond pads 110A are coupled to, for example, a power supply strip 120 via wire bonds 130. Wire-bond pads 110B are coupled to, for example, a ground strip 140 via wire bonds 130.

The power supply strip 120 and/or the ground strip 140 may be disposed, for example, in a package (e.g., an electronic package) that house the die 100. The power supply strip 120 and/or the ground strip 140 may be used, for example, to aggregate wire bonds for similar supplies within the package and may be routed, for example, to external leads on the package.

Figure 3A:
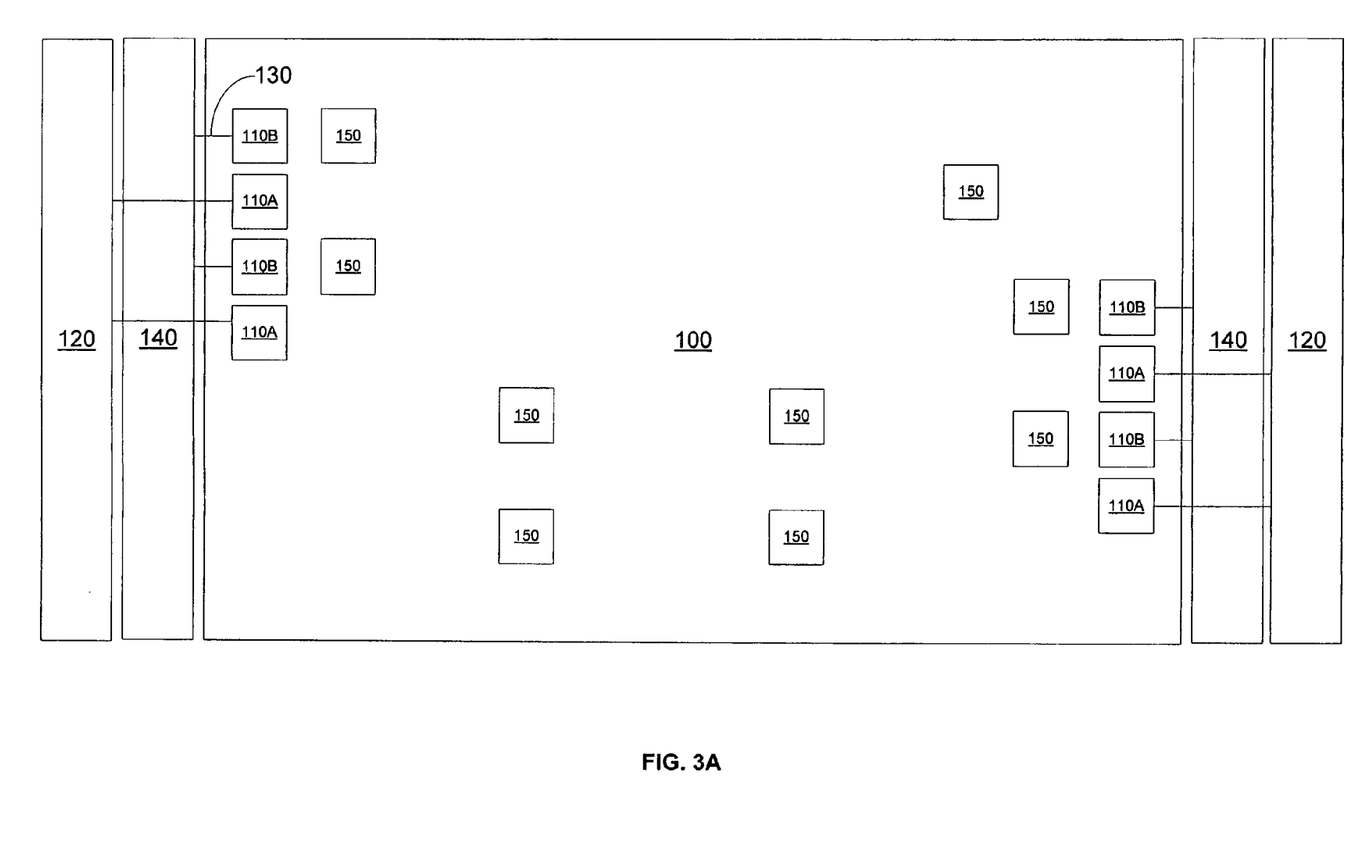
FIG. 3A shows an embodiment of pads distributed across the die surface according to some aspects of the present invention.
Figure 3B:
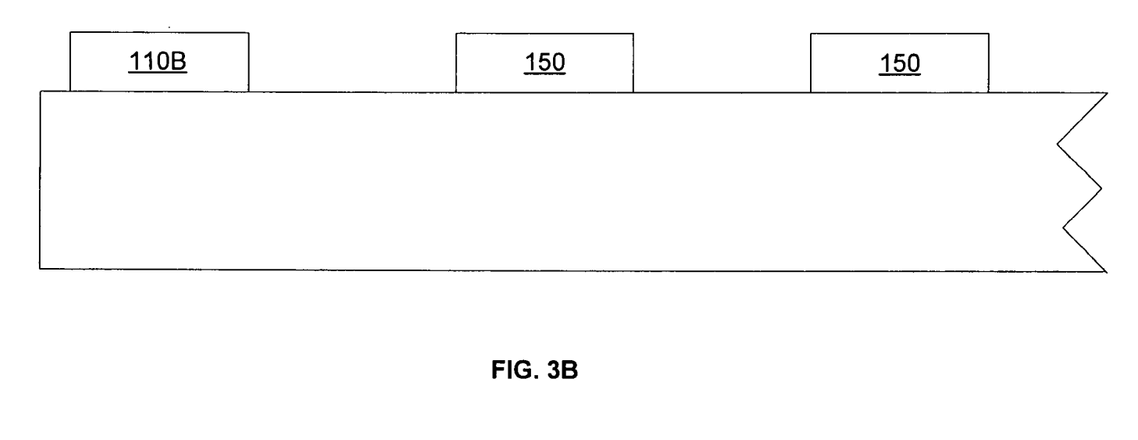
FIG. 3B shows a partial cross sectional view of the die arrangement shown in FIG. 3A.

FIG. 3A shows an embodiment of ground pads distributed across the die surface according to some aspects of the present invention. Ground pads 150 are disposed across the die surface. FIG. 3B shows a partial cross sectional view of the die arrangement shown in FIG. 3A. FIG. 3B shows the ground wire-bond pad 110B and the ground pads 150 disposed on the die surface.

Figure 4A:
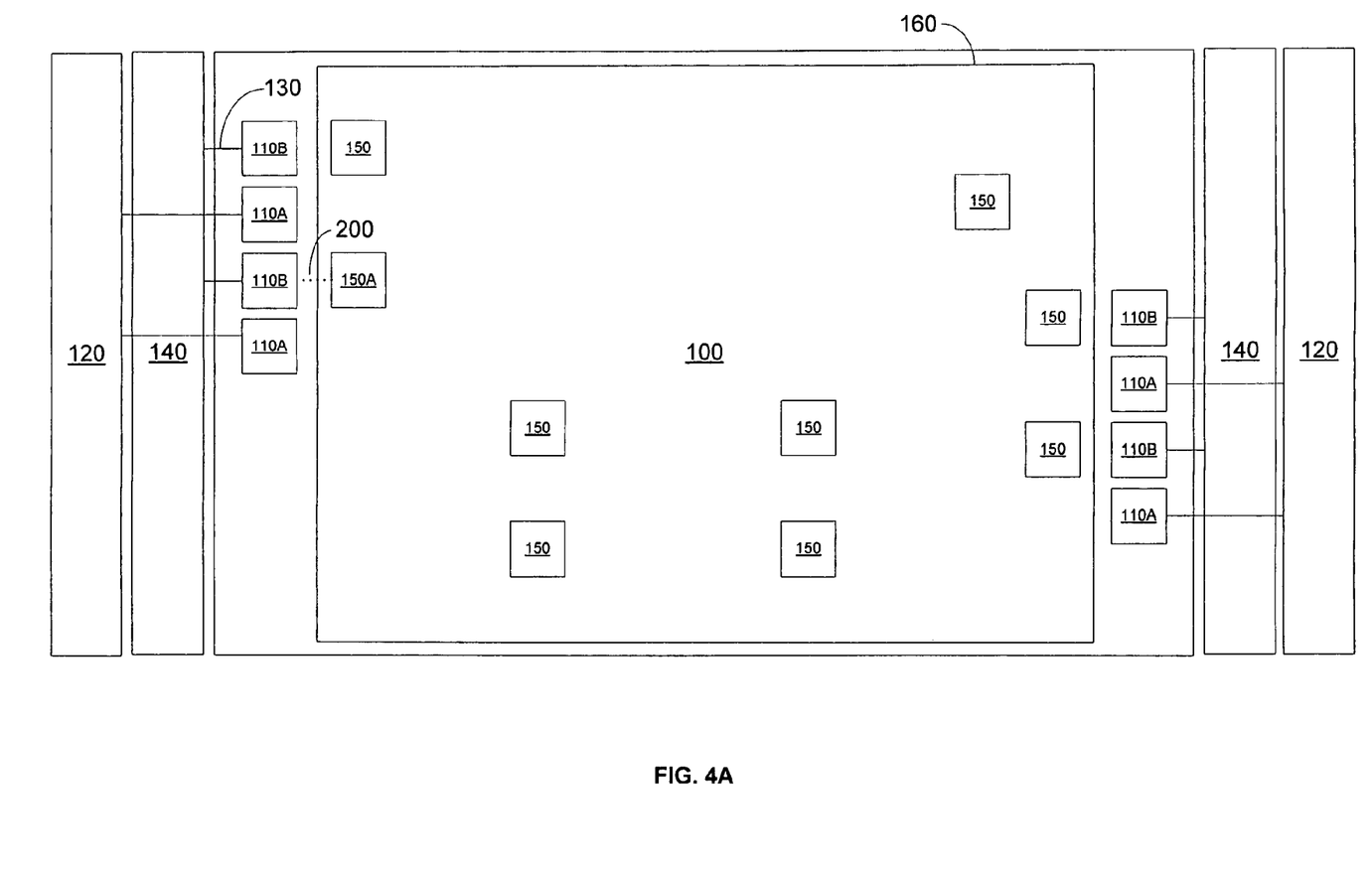
FIG. 4A shows an embodiment of a die arrangement according to some aspects of the present invention.
Figure 4B:
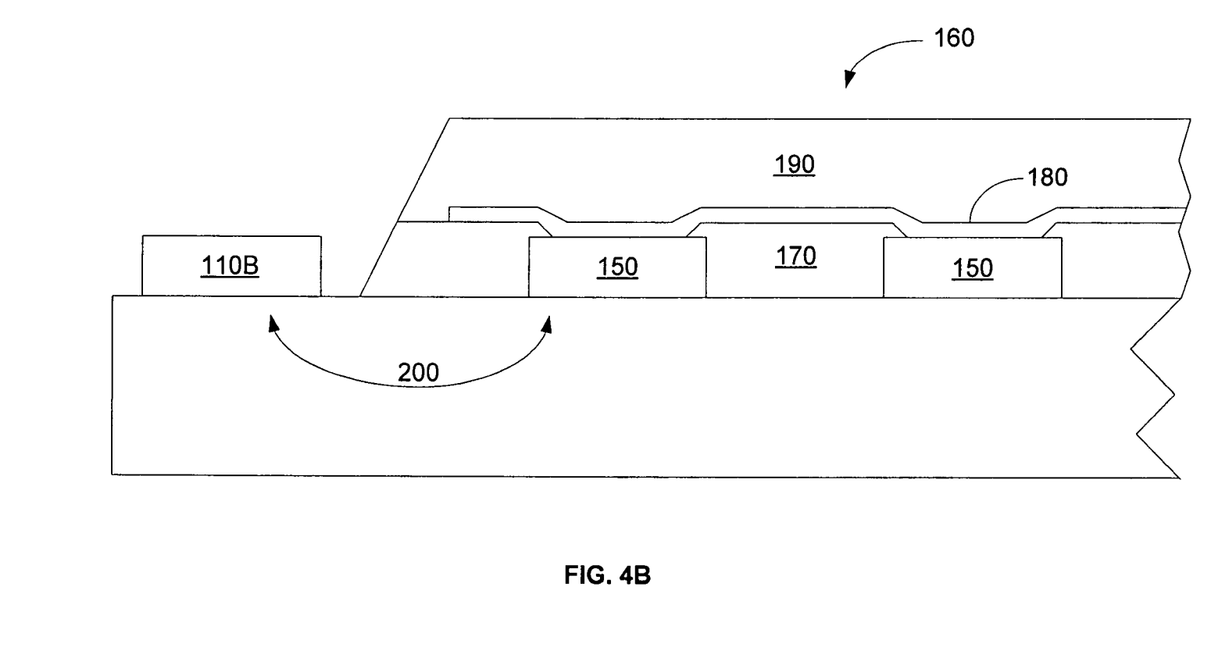
FIG. 4B shows a partial cross sectional view of the die arrangement shown in FIG. 4A.

FIG. 4A shows an embodiment of a die arrangement according to some aspects of the present invention. FIG. 4B shows a partial cross sectional view of the die arrangement shown in FIG. 4A. A redistribution layer 160 is added across portions of the die surface and may provide, for example, an additional low resistance metal layer onto the die. Some embodiments according to some aspects of the present invention provide that the redistribution layer 160 does not provide internal chip layers. In some embodiments according to some aspects of the present invention, the redistribution layer 160 is added over the portions of the die surface with ground pads 150. In some embodiments according to some aspects of the present invention, the redistribution layer 160 is not added to portions of the die surface with wire-bond pads 110. The redistribution layer 160 may include, for example, a dielectric layer 170 that is added to the die surface and may be added, for example, to a portion of the surface of at least some of the ground pads 150. A metal layer 180 may then be added over the dielectric layer 170. The metal layer may be in contact with the ground pads 150. Some embodiment according to some aspects of the present invention, the metal layer 180 may couple the ground pads 150 with each other. Another dielectric layer 190 may be added over the metal layer 180 and the dielectric layer 170.

Some embodiments according to the present invention may provide that the ground pads are coupled to the wire-bond pads. For example, FIG. 4A shows a particular ground pad 150A that is disposed near a wire-bond pad 110B, which is coupled to ground strip 140 via a wire bond 130. The particular ground pad 150A may be coupled to the wire-bond pad 110B through, for example, an internal chip-layer connection 200. The particular ground pad 150A may then couple the other pads 150 via the metal layer 180 of the redistribution layer 160. Thus, ground pads 150A that are distributed over the die surface can provide local access to the ground strip 140.

The dielectric layer 170 and/or the dielectric layer 190 may be thick enough so as to effectively reduce interference transmitted by the metal layer 180 or the pads 210.

Figure 5:
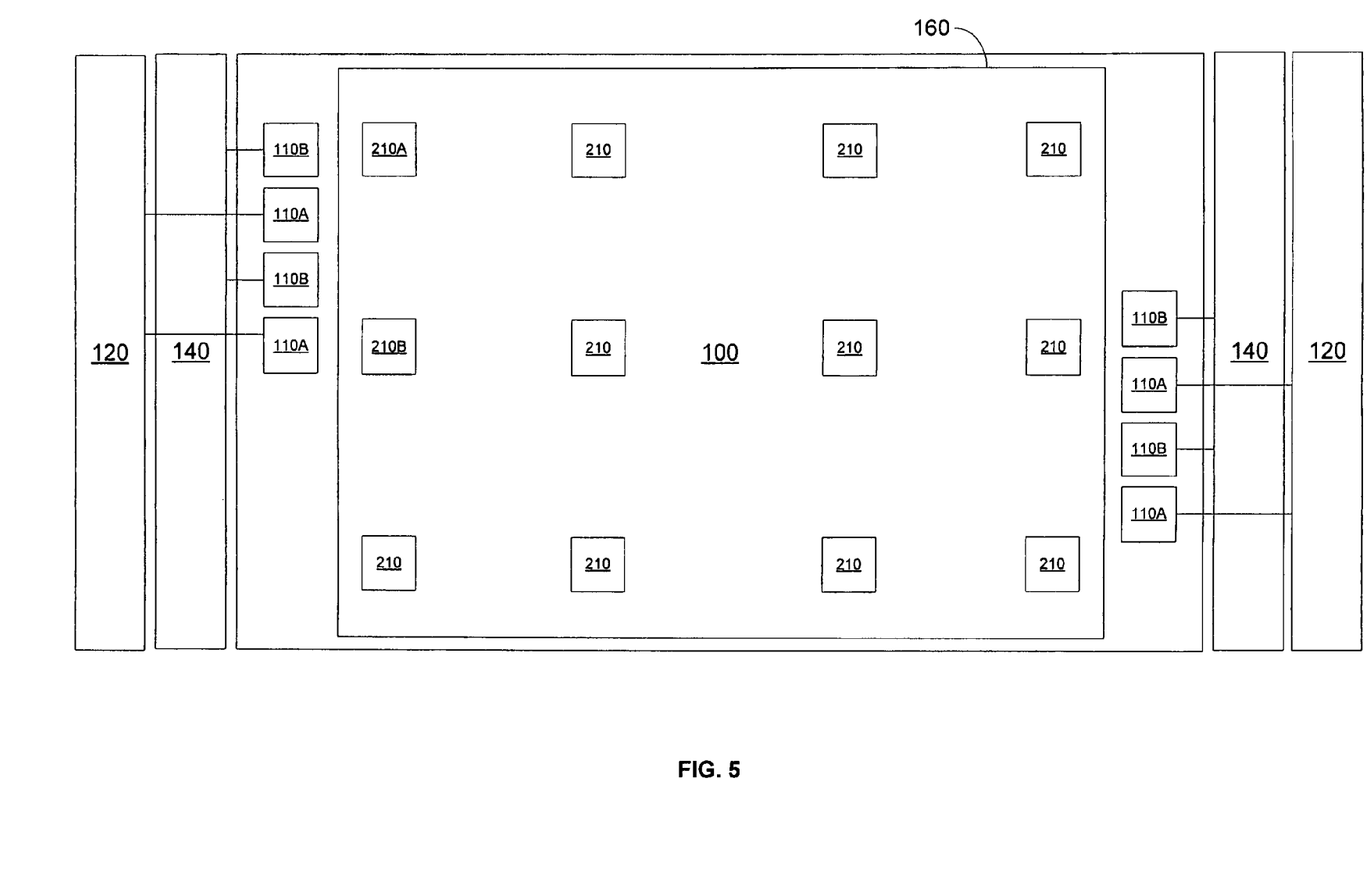
FIG. 5 shows an embodiment of a pad distribution over a die surface according to some aspects of the present invention.

Some embodiments according to some aspects of the present invention may provide, for example, a single supply source across the die surface. For example, FIG. 5 shows pads 210 distributed throughout a die surface. In some embodiments according to some aspects of the present invention, the pads 210 are all coupled to a single supply source. For example, the pads 210 may all be coupled via a redistribution layer to a particular pad 210A which is coupled (e.g., coupled via an internal chip-layer connection) to a wire-bond pad 110B which, in turn, is coupled to a ground strip 140. In another example, the pads 210 may all be coupled to a particular pad 210B which is coupled to a wire-bond pad 110A which, in turn, is coupled to a power supply strip 120.

Figure 6:
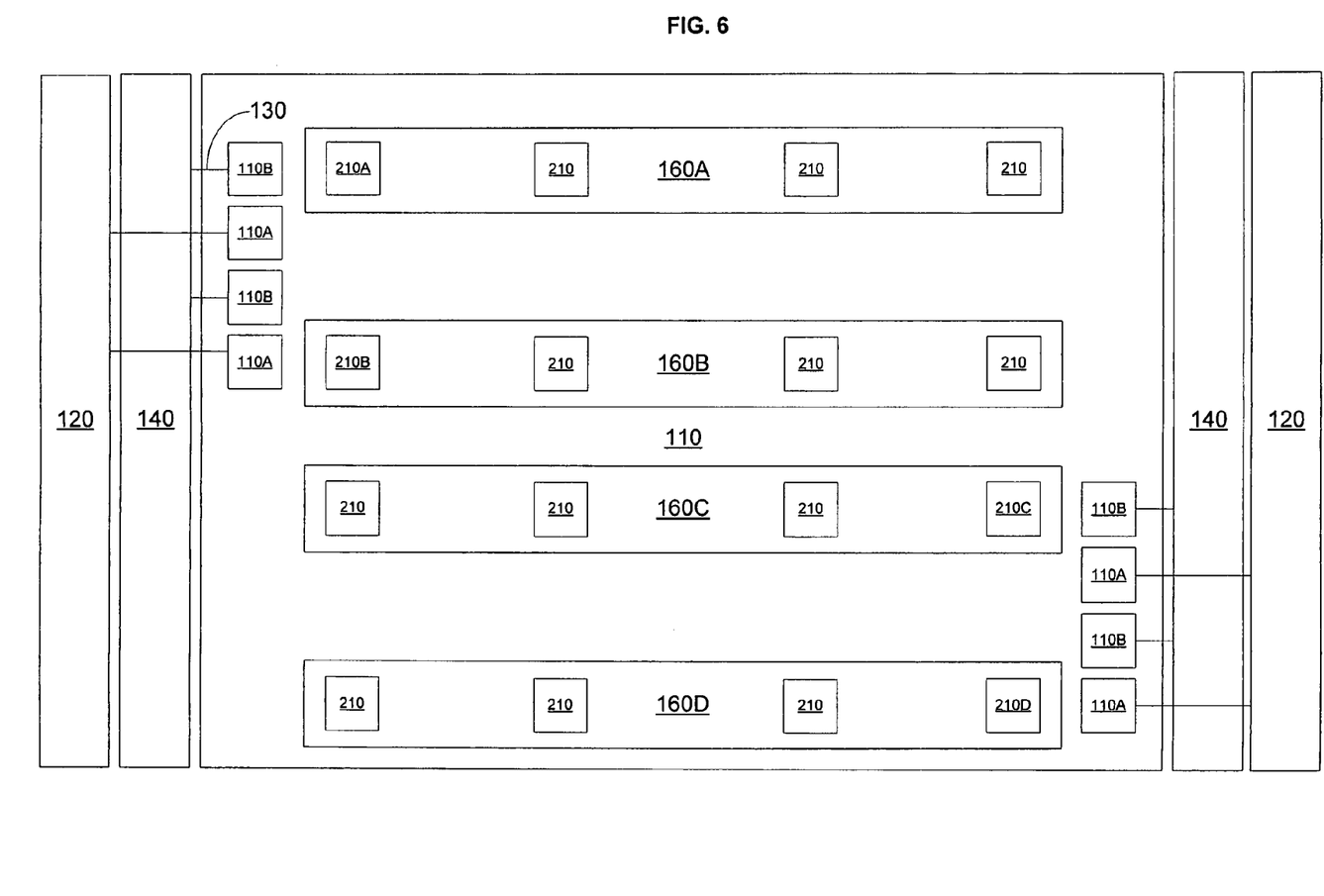
FIG. 6 shows an embodiment of sets of pads distributed over a die surface according to some aspects of the present invention.

Some embodiments according to some aspects of the present invention may provide, for example, multiple supply sources across the die surface. For example, FIG. 6 shows rows of pads 210. The particular pad 210A may be coupled to the wire-bond pad 110B that is coupled to the ground strip 140. The other pads 210 in the row may be coupled to the particular pad 210A via a redistribution layer 160A. The particular pad 210B may be coupled to the wire-bond pad 110A that is coupled to the power supply strip 120. The other pads 210 in the row may be coupled to the particular pad 210B via a redistribution layer 160B. The redistribution layers 160A, 160B may be isolated from each other.

The pads 210 in the redistribution layer 160A may be coupled to other pads 210 in other redistribution layers disposed throughout the die surface. For example, the pads 210 of the redistribution layer 160A may be coupled to the pads 210 of the redistribution layer 160C. Thus, the pads 210 of the redistribution layer 160C may be coupled to the ground strip 140 via the pads 210 of the redistribution layer 160A. In addition, the pads 210 of the redistribution layer 160C may have its own more direct connection to ground strip 140 via, for example, a particular pad 210C. The particular pad 210C may be coupled to one of the wire-bond pads 110B that is coupled to the ground strip 140 via a wire bond 130.

The pads 210 in the redistribution layer 160A might not be directly coupled to other pads 210 in other redistribution layers disposed throughout the die surface. For example, the pads 210 of the redistribution layer 160C may be coupled to the ground strip 140 only via, for example, a particular pad 210C.

Similarly, the pads 210 of the redistribution layer 160D may be coupled to the pads 210 of the redistribution layer 160B. The pads 210 of the redistribution layer 160B may be coupled to the power supply strip 120 via a particular pad 210B. The pads 210 of the redistribution layer 160D may be coupled to the power supply strip 120 via the pads 210 of the redistribution layer 160B. In addition, the pads 210 of the redistribution layer 160D may be coupled to the power supply strip 120 via a particular pad 210D. The particular pad 210D may be coupled to one of the wire-bond pads 110A that are coupled to the power supply strip 120 via a wire bond 130.

The pads 210 in the redistribution layer 160B might not be directly coupled to other pads 210 in other redistribution layers disposed throughout the die surface. For example, the pads 210 of the redistribution layer 160D may be coupled to the power supply strip 120 only via, for example, a particular pad 210D.

Although some exemplary embodiment may use the redistribution layer 160D to couple pads 210 to a power supply strip 120 and a ground strip 140, some embodiments according to some aspects of the present invention may couple the pads 210 to more than two power supply strips. In addition, the redistribution layer 160D may also couple pads 210 to signals carried by one or more wire-bond pads 110. For example, clock signals may be distributed to the pads 210 over the redistribution layer 160.

Figure 7:
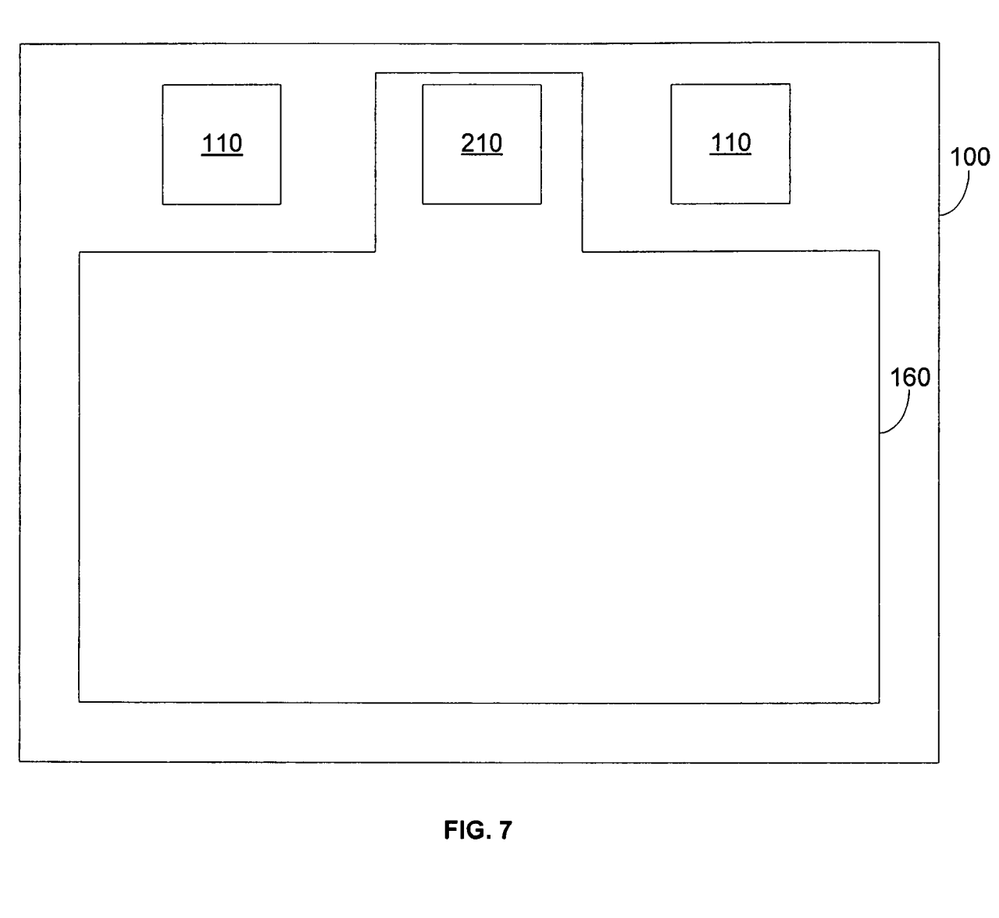
FIG. 7 shows an embodiment of a die arrangement according to some aspects of the present invention.

FIG. 7 shows an embodiment of a die arrangement according to some aspects of the present invention. A pad 210 is disposed on the edge of the die 100. In the illustrated example, the pad 210 is disposed along the edge of the die 100 between two wire-bond pads 110. The pad 210 may be coupled to one of the wire-bond pads 110 via, for example, an internal chip-layer connection. The redistribution layer 160 extends over the pad 210 and couples the pad 210 to other pads (not shown) distributed throughout the die 100. The pad 210 may even be a wire-bond pad 110 without any wire bonds.

Figure 8:
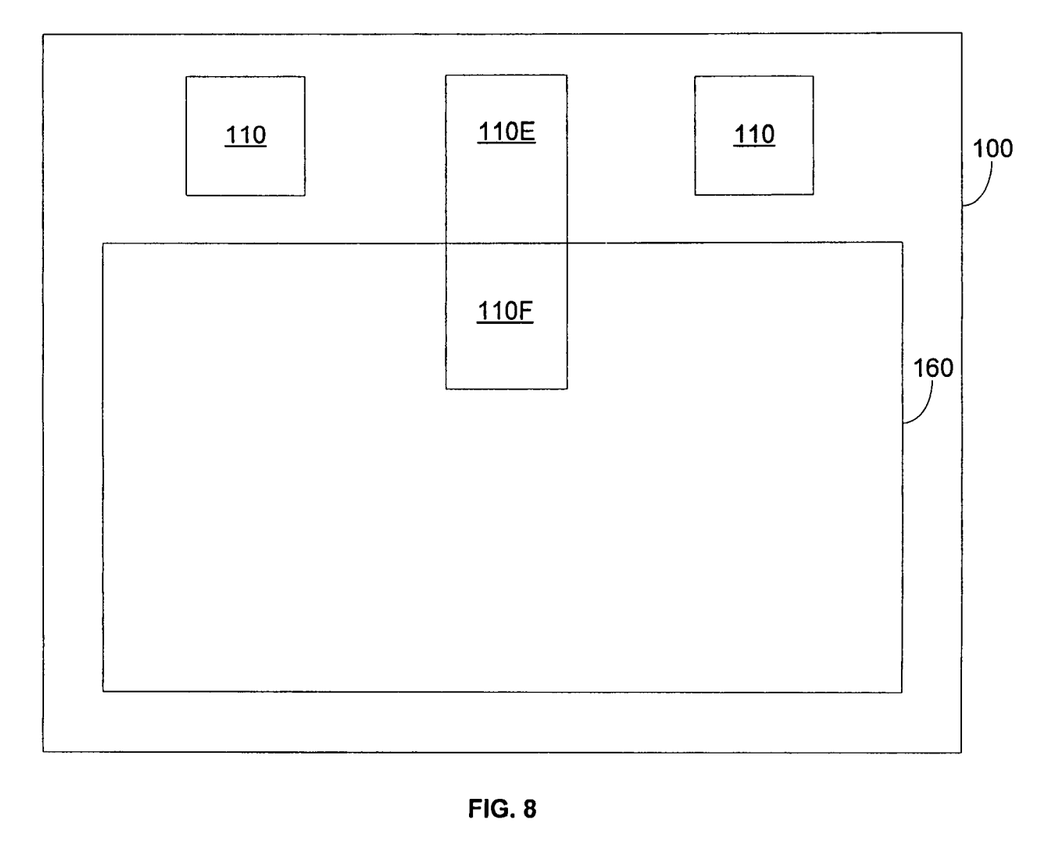
FIG. 8 shows an embodiment of a die arrangement according to some aspects of the present invention.

FIG. 8 shows an embodiment of a die arrangement according to some aspects of the present invention. In the illustrated example, wire-bond pads 110 are disposed along the edge of the die 100. One of the wire-bond pads 110 may include an extension 110F. The redistribution layer 160 extends over the extension 110F and couples the extension 110F to the pads 210 (not shown) distributed throughout the die 100. The particular wire-bond pad 110E may be coupled to, for example, a particular power supply via a wire bond 130. In another embodiment, the redistribution layer 160 may extend over a portion of a wire-bond pad 110 without an extension.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A die arrangement, comprising:
   a wire-bond pad operatively coupled to a power supply via a wire bond;
   a first pad operatively coupled to the wire-bond pad via an internal chip-layer connection; and
   a second pad operatively coupled to the first pad via a redistribution layer,
   wherein an electrical connection from the second pad to the power supply comprises the redistribution layer, the first pad, the internal chip-layer connection, the wire-bond pad and the wire bond, and
   wherein a portion of the redistribution layer is disposed over the first pad and the second pad.

2. The die arrangement according to claim 1, wherein power supply is a voltage source.

3. The die arrangement according to claim 1, wherein the power supply is an electrical ground.

4. The die arrangement according to claim 1, wherein the power supply is a current source.

5. The die arrangement according to claim 1, wherein the second pad is operatively coupled to the power supply via the first pad, the internal chip-layer connection, the wire-bond pad and the wire bond.

6. The die arrangement according to claim 1, wherein a plurality of pads are operatively coupled to the first pad via the redistribution layer.

7. The die arrangement according to claim 1, wherein the redistribution layer comprises a first dielectric layer, a metal layer and a second dielectric layer.

8. The die arrangement according to claim 7, wherein the metal layer operatively couples the first pad to the second pad.

9. The die arrangement according to claim 1, wherein the first pad and the second pad are not wire-bond pads.

10. The die arrangement according to claim 1, wherein the wire bond is operatively coupled to a wire-bond pad of a package.

11. The die arrangement according to claim 10, wherein wire-bond pad of the package is operatively coupled to the power supply.

12. The die arrangement according to claim 11, wherein the package is operatively coupled to a printed circuit board via external leads of the package.

13. A method for reducing voltage drop in an integrated circuit, comprising:
   adding a first pad on a die surface near a wire-bond pad;
   operatively coupling the wire-bond pad to a power supply via a wire bond;
   operatively coupling the first pad to the wire-bond pad via an internal chip-layer connection;
   adding a plurality of pads across the die surface;
   adding a portion of a redistribution layer over the first pad and the plurality of pads; and
   operatively coupling the plurality of pads to the first pad via the redistribution layer,
   wherein a particular pad of the plurality of pads is operatively coupled to the power supply via the redistribution layer, the first pad, the internal chip-layer connection, the wire-bond pad and the wire bond.

14. The method according to claim 13, wherein the die surface is a surface of a finished die comprising the integrated circuit.

15. The method according to claim 13, comprising:
adding a second wire-bond pad operatively coupled to an electrical ground via a second wire bond;
adding a second pad on the die surface near the second wire-bond pad;
operatively coupling the second pad to the second wire-bond pad via a second internal chip-layer connection;
adding a second plurality of pads across the die surface; and
adding a second redistribution layer over the second pad and the second plurality of pads such that the second distribution layer provides an electrical connection between the second pad the second plurality of pads,
wherein the first distribution layer and the second distribution layer do not overlap, and
wherein a second particular pad of the second plurality of pads is operatively coupled to the electrical ground via the redistribution layer, the second pad, the second internal chip-layer connection, the second wire-bond pad and the second wire bond.

16. The method according to claim 13, comprising:
operatively coupling the wire-bond pad to a signal.

17. A die arrangement, comprising:
a first wire-bond pad;
a second wire-bond pad;
a first set of pads comprising a first pad and a second pad, the first pad being directly coupled to the second pad via a first redistribution layer, the first redistribution layer being in direct contact with the first pad and the second pad, a portion of first redistribution layer being disposed over the first set of pads, the first redistribution layer being characterized by a first voltage value; and
a second set of pads comprising a third pad and a fourth pad, the third pad being directly coupled to the fourth pad via a second redistribution layer, the second redistribution layer being in direct contact with the third pad and the fourth pad, a portion of the second redistribution layer being disposed over the second set of pads, the second redistribution layer being characterized by a second voltage value,
wherein the first wire-bond pad is operatively coupled to the first pad,
wherein the second pad is operatively coupled to the first wire-bond pad via the first redistribution layer and the first pad,
wherein the second wire-bond pad is operatively coupled to the third pad, and
wherein the fourth pad is operatively coupled to the first wire-bond pad via the second redistribution layer and the third pad.

18. The die arrangement according to claim 17,
wherein the first wire-bond pad is operatively coupled to a first power supply via a first wire bond, and
wherein the first power supply is not electrical ground.

19. The die arrangement according to claim 18,
wherein the second wire-bond pad is operatively coupled to a second power supply via a second wire bond,
wherein the second power supply is different from the first power supply, and
wherein the second power supply is not electrical ground.

20. The die arrangement according to claim 19, wherein the second pad is operatively coupled to the first power supply via the first pad.

21. The die arrangement according to claim 20, wherein the fourth pad is operatively coupled to the second power supply via the third pad.

22. The die arrangement according to claim 21, wherein the second pad comprises a plurality of pads.

23. The die arrangement according to claim 21, wherein the fourth pad comprises a plurality of pads.

24. The die arrangement according to claim 17, wherein none of the first pad, the second pad, the third pad, the fourth pad is a wire-bond pad.

25. A die arrangement, comprising:
a wire-bond pad comprising a first portion and a second portion, the first portion being adapted to be operatively coupled to a wire bond, the wire bond being operatively coupled to a power supply strip;
a plurality of non-wire-bond pads disposed across the surface of the die arrangement; and
a portion of a redistribution layer disposed over and in contact with the plurality of pads and the second portion of the wire-bond pad,
wherein the redistribution layer provides operatively coupling between the second portion of the wire-bond pad and the plurality of non-wire-bond pads, and
wherein an electrical path from any of the plurality of non-wire-bond pads to the power supply strip comprises the redistribution layer, the wire-bond pad and the wire bond.

* * * * *